US009960036B2

(12) United States Patent
Sundaram et al.

(10) Patent No.: US 9,960,036 B2
(45) Date of Patent: May 1, 2018

(54) METHOD AND APPARATUS FOR FORMING DEVICE QUALITY GALLIUM NITRIDE LAYERS ON SILICON SUBSTRATES

(71) Applicant: Ultratech, Inc., San Jose, CA (US)

(72) Inventors: Ganesh Sundaram, Concord, MA (US); Andrew M. Hawryluk, Los Altos, CA (US); Daniel Stearns, Los Altos Hills, CA (US)

(73) Assignee: Ultratech, Inc., San Jose, CA (US)

(*) Notice: Subject to any disclaimer, the term of this patent is extended or adjusted under 35 U.S.C. 154(b) by 0 days. days.

(21) Appl. No.: 15/457,460

(22) Filed: Mar. 13, 2017

(65) Prior Publication Data
US 2017/0213718 A1 Jul. 27, 2017

Related U.S. Application Data

(63) Continuation of application No. 14/909,004, filed as application No. PCT/US2014/056172 on Sep. 17, 2014, now Pat. No. 9,666,432.
(Continued)

(51) Int. Cl.
*H01L 29/15* (2006.01)
*H01L 31/0256* (2006.01)
(Continued)

(52) U.S. Cl.
CPC ........ *H01L 21/0251* (2013.01); *C30B 25/183* (2013.01); *C30B 29/06* (2013.01);
(Continued)

(58) Field of Classification Search
CPC ........... H01L 21/0262; H01L 21/02694; H01L 29/2003; H01L 21/02675; H01L 21/02598;
(Continued)

(56) References Cited

U.S. PATENT DOCUMENTS

| 9,666,432 B2* | 5/2017 | Sundaram | H01L 21/268 |
| 2012/0329208 A1* | 12/2012 | Pore | C23C 16/305 |
| | | | 438/102 |
| 2016/0155629 A1* | 6/2016 | Hawryluk | H01L 21/268 |
| | | | 438/509 |

FOREIGN PATENT DOCUMENTS

| JP | 62-172715 A | 7/1987 |
| JP | 05-082447 A | 2/1993 |
| WO | 2004/062341 A2 | 7/2004 |

OTHER PUBLICATIONS

English Translation of Office Action, JP 2016-523884, dated Dec. 27, 2017.
(Continued)

*Primary Examiner* — Victor A Mandala
(74) *Attorney, Agent, or Firm* — Royse Law Firm, PC

(57) ABSTRACT

Atomic Layer Deposition (ALD) is used for heteroepitaxial film growth at reaction temperatures ranging from 80-400° C. The substrate and film materials are preferably matched to take advantage of Domain Matched Epitaxy (DME). A laser annealing system is used to thermally anneal deposition layer after deposition by ALD. In preferred embodiments, a silicon substrate is overlaid with an AlN nucleation layer and laser annealed. Thereafter a GaN device layer is applied over the AlN layer by an ALD process and then laser annealed. In a further example embodiment, a transition layer is applied between the GaN device layer and the AlN nucleation layer. The transition layer comprises one or more different transition material layers each comprising a $Al_xGa_{1-x}N$ compound wherein the composition of the transition layer is continuously varied from AlN to GaN.

16 Claims, 11 Drawing Sheets

Related U.S. Application Data

(60) Provisional application No. 61/881,369, filed on Sep. 23, 2013.

(51) Int. Cl.
*H01L 21/02* (2006.01)
*H01L 21/324* (2006.01)
*H01L 29/20* (2006.01)
*C30B 25/18* (2006.01)
*C30B 29/06* (2006.01)
*C30B 29/40* (2006.01)

(52) U.S. Cl.
CPC ........ *C30B 29/406* (2013.01); *H01L 21/0254* (2013.01); *H01L 21/0262* (2013.01); *H01L 21/02381* (2013.01); *H01L 21/02433* (2013.01); *H01L 21/02458* (2013.01); *H01L 21/02694* (2013.01); *H01L 21/3245* (2013.01); *H01L 29/2003* (2013.01)

(58) Field of Classification Search
CPC ............... H01L 21/3245; H01L 21/268; H01L 21/02433; H01L 21/02458; H01L 21/0254; H01L 21/02381
See application file for complete search history.

(56) References Cited

OTHER PUBLICATIONS

Response to Office Action JP 2016-543977, filed Feb. 2, 2018.
English Translation of Response to Office Action, CN 201480052408.1, filed Jan. 18, 2018.
English Translation of Office Action, CN 201480038172.6, dated Dec. 27, 2017.

* cited by examiner

METHOD AND APPARATUS FOR FORMING DEVICE QUALITY GALLIUM NITRIDE LAYERS ON SILICON SUBSTRATES

1 CROSS REFERENCE TO RELATED U.S. PATENT APPLICATIONS

This application is a continuation of U.S. patent application Ser. No. 14/909,004 which is a 371 entry of PCT Appl. No. PCT/US14/56172 on Sep. 17, 2014 which claims the benefit of U.S. Provisional Appl. No. 61/881,369 filed Sep. 23, 2013 entitled DEPOSITION AND PROCESSING METHODS FOR GROWING GALLIUM NITRIDE AND ALUMINUM NITRIDE ON SILICON both of which are incorporated herein in their entireties.

2 BACKGROUND OF THE INVENTION

2.1 Field of the Invention

The exemplary, illustrative, technology herein relates to systems and methods for growing device quality Gallium Nitride (GaN) thin film layers onto a silicon substrate.

The technology herein has applications in the areas of solid state power devices such as switches; rectifiers and other power devices as well as electro-optical devices such as lasers and light emitting diodes (LEDs) whether fabricated as a stand-alone device or incorporated into a solid state integrated circuit device.

2.2 The Related Art

Conventional solid state power electronics is dominated by silicon (Si) devices in part because silicon device fabrication is a very mature and inexpensive technology with widely available design and manufacturing resources. Conventional solid state devices comprise a substantially single crystal silicon substrate layer and a silicon device layer or layers formed onto the substrate using a high temperature epitaxial deposition processes such chemical or gas deposition. An important requirement of the device layer or layers used in electronic and electro-optic devices is that the device layer also be formed as a substantially single crystal layer to achieve the desired electrical and optical properties. While some polycrystalline device layers are usable, substantially single crystal device layers are desirable for improved performance.

Several factors largely influence the crystal structure of the device layer. The first is how the crystal lattice structure or lattice spacing of the substrate layer compares with the crystal lattice structure or lattice spacing of the device layer. The second is how the coefficient of thermal expansion (CTE) of the substrate layer compares with the CTE of the device layer. The third is the deposition or reaction temperature of the deposition process used to deposit the device layer onto the substrate layer.

2.3 Crystal Lattice Mismatch

When the crystal lattice structure or lattice spacing is largely mismatched, e.g. between dissimilar materials, the crystal lattice spacing of the device layer attempts to match the lattice spacing of the substrate near the interface and this action generally disorganizes the formation of the natural lattice spacing of the device layer to the point that the device layer formed is substantially amorphous or polycrystalline or that dislocations in the device layer crystal lattice disrupt single crystal growth causing a flawed single crystal structure or a polycrystalline structure. In practice flaws in the single crystal structure potentially leading to cracking in the device layer especially when the device layer is stressed by a rapid thermal cycling. The conventional solution to this problem has been to grow silicon devices on silicon substrates which encourages single crystal growth and avoids the potential crystal lattice disruption at the interface. However, silicon devices have failed to provide the desired electrical properties in many applications, especially in power devices such as power switches and rectifiers and further in optical devices that benefit from higher band gap materials such a Gallium Nitride (GaN).

In particular, silicon has significant limitations in power applications particularly with respect to excessive Joule heating which consumes operating power and is largely the reason why electronic systems require cooling, which further consumes operating power. This is especially problematic in battery powered systems where battery powered operating time is significantly reduced by Joule heating and system cooling used to alleviate the Joule heating. Another silicon based device limitation in power devices is its relatively low blocking voltage which limits the use of many silicon devices to low voltage applications, (e.g. <200 volts). A further silicon based device limitation is its relatively low bandwidth which limits switching speed in high speed devices such as switching power supplies of DC-DC power converters and limits its optical properties for use in visible wavelength emitters.

In spite of these limitations silicon based solid-state electronic devices are ubiquitously employed in the power control and distribution systems of most computers, automobiles, communications, consumer electronics, robotics, motor drives, electric power transmission and electric power generation systems. While this is largely due to the fact that silicon based solid state power systems are readily available and inexpensive there is a need in the art to develop more efficient, higher powered and faster switching power devices which in many cases exceed the practical limitations of conventional silicon power devices.

Device designers have long ago recognized that wide bandgap (WBG) semiconductor materials i.e. having a wider bandgap than silicon have more favorable properties for solid state power devices and electro-optical devices. In particular, TABLE 1 compares the band gap and electrical properties of silicon vs wider bandgap semiconductors including silicon carbide (SiC) and gallium nitride (GaN) and diamond. As shown, all the WBG semiconductors provide an order of magnitude increase in critical electric field value (V/cm), which directly increases the blocking voltage of the power devices. Similarly, all the WBG semiconductors provide at least a 4× increase in maximum operating temperature (° C.) which reduces Joule heating and potentially eliminates the need for cooling in many applications. In particular, there is a need in the art to develop WBG device layers to address certain power and optical device needs not easily met by silicon devices and especially to develop GaN device layers.

One solution to using WBG semiconductor devices has been to change the substrate material to one that more closely matches the crystal lattice structure of the device layer. In one example solution that is commercially available GaN devices are grown onto Silicon Carbide (SiC) substrates specifically to reduce crystal lattice spacing mismatch as compare to GaN grown onto a silicon substrate. This is demonstrated by FIG. 1a which plots lattice spacing mismatch (in Å) vs. growth order of Sapphire ($Al_2O_3$), Silicon (Si), Silicon Carbide (SiC), Aluminum Nitride (AlN) and Gallium Nitride (GaN). As shown in FIG. 1a the lattice spacing of GaN is most closely matched to AlN (120a) followed by SiC, Si (130a) and finally $Al_2O_3$.

In another exemplary solution that is commercially available GaN devices are grown onto Sapphire substrates to reduce thermal stresses induced into the substrate and device layer as a result of rapid and often non-homogeneous heating and cooling during the deposition process (discussed below). In particular, the sapphire substrate more closely matches the coefficient of thermal expansion of the GaN device layer as compared to a silicon substrate and therefore the combination of GaN grown on Sapphire is less susceptible to thermal stresses that lead to wafer bow, cracking and generally degraded performance in the device layer. As shown in FIG. 1b the coefficient of thermal expansion (CTE) of GaN is more closely matched to the CTE of Sapphire than is to Si. In particular, the CTE of GaN is most closely matched to SiC and AlN followed by sapphire and then silicon.

However, in both of these solutions the need for a non-silicon substrate layer requires specialized processing equipment to grow and process non-silicon substrates substantially increasing end user device cost and virtually eliminates integration of GaN devices into silicon based integrated circuits except as an added stand-alone component. While these conventional solutions meet a niche demand for GaN devices where a silicon device is inadequate; they come at a high cost and in limited configurations mainly due to their inability to be manufactured using convention silicon based processes. Accordingly, there is still a need to form device quality (i.e. substantially single crystal growth) GaN device layers onto silicon substrates.

It is known that high temperature deposition processes increasingly favor the formation of single crystal films. For example, Strike et al. in *GaN, AlN and InN: a Review* (J. Vac. Sci. Technology B 10(4), July/August 1992) discuss how heteroepitaxial growth of device layers of the III-V nitrides occurs on a sapphire substrate when GaN films are applied by a metal-organic chemical vapor deposition (MOCVD) process with reaction temperatures between 900 and 1000° C. However, Strike et al. specifically points out that the sapphire substrate is used for its stability at high temperature (1000° C.) required for epitaxial growth in various CVD techniques, even though sapphire has a less than desirable crystal lattice spacing mismatch and a less than desirable CTE as compared to GaN.

While it is widely accepted that the high reaction temperature of the MOCVD process favors heteroepitaxial growth that exhibits single crystal film behavior e.g. as determined by X-ray diffraction analysis, the high reaction temperature has other drawbacks associated with stresses induced into the substrate and the device layer as a result of rapid and often non-homogeneous heating and cooling during the deposition process as well as the incorporation of unwanted materials into the substrate, e.g. caused by diffusion of the device layer material into the substrate.

In a conventional MOCVD reactor, stress management is a primary concern and limits the quality of the deposition. In particular wafer bow resulting from thermal cycling is a primary concern in MOCVD process equipment and is preferably limited to less than 100 µm or less in order for the wafer to be further process on conventional wafer handling and processing tools for high volume manufacturing. While this problem has been addressed by forming "stress compensation layers" in MOCVD films these stress compensation layers degrade the device layer performance and add cost.

Recently attempts have been made to grow device quality GaN onto a Si substrate by metal-organic chemical vapor deposition (MOCVD). However when the GaN is grown directly onto the silicon substrate there is undesirable cracking due to the large crystal lattice spacing mismatch (16.9%) between the GaN and the silicon and the large coefficient of thermal expansion (CTE) mismatch between GaN ($\alpha_a$ 5.59× $10^{-6}$ $K^{-1}$) and Si($\alpha_a$ 3.77×$10^{-6}$ $K^{-1}$). In particular Pan et al. (*Growth of GaN film on Si*(111) *Substrate using a AlN sandwich structure as buffer* Joun. Of Crystal Growth 318 (2011) 464-467) report that the GaN epitaxial layers grown uniformly on Si substrates suffer from randomly distributed cracks, which are mostly caused by the CTE mismatch.

Pan et al. offer several solutions including first growing a buffer layer of high temperature H-T Aluminum Nitride (AlN) onto the silicon substrate by MOCVD, which performs two functions: a) to reduce crystal lattice spacing mismatch; and, b) to provide a nucleation layer for the GaN layer. In addition, Pan et al. suggest several other example structures combining the H-T nucleation layer e.g. AlN over laid with a combination of layers in the Al—Ga—N ternary system. The problem is that the nucleation layer is polycrystalline due to the crystal lattice spacing mismatch between AlN and Si, and the spacing mismatch causes the grain boundaries between the nucleation layer and the GaN layer to produce a high density of dislocations or domain mismatches in the epitaxial GaN layer. While Pan et al. report that cracking in the GaN layer is reduced by the application of the high temperature H-T AlN buffer or nucleation layer which provides less lattice spacing mismatch with the GaN layer as compared to the lattice spacing mismatch of GaN with the silicon substrate: this solution fails to address the problems associated with high reaction temperature of the MOCVD process which still leads to wafer bow, which increases with increased device layer thickness. Accordingly, no solution is currently provided to overcome the need for high temperature epitaxial growth provided by MOCVD and other high temperature deposition techniques while avoiding the problems associated with the resulting wafer bow and cracking typical of high reaction temperature processes.

Finally, there is a further important limitation imposed by the approach of growing GaN on a dissimilar substrate with a nucleation layer. In particular, the key role of the nucleation layer in promoting the epitaxial growth precludes the option of having device layers at the bottom of the GaN film for vertical device architectures. Unfortunately, this limitation is devastating for designing high-power devices, where the vertical architectures often have significant performance advantages in carrying high current loads and blocking high voltage. In particular, vertical architectures take advantage of an increased device layer thickness (e.g. 3 µm or more) to increase the breakdown voltage of the device (e.g. to 1000 Volts or more). However, in order to take advantage of the increased layer thickness terminals are required on opposing faces of the device layer which means that both the substrate and the nucleation layer needs to be removed to gain access to both faces of the device layer. Accordingly, no solution is currently provided to overcome the need for building vertical devices when the device layer includes a nucleation layer applied between the substrate and the device layer.

There are three independent areas where the growth of high quality films is important. The first is in the growth of the bulk film (the multiple microns of film on top of the substrate) such as for vertical devices. The second is in the growth of the gate structure (on top of the oxide), and the third (for planar devices) is in the region between the gate and the drain to passivate the surface. In this third region, surface states (traps) on planar high-electron-mobility-transistor (HEMT) devices lead to current collapse in the device and the deposition of high quality GaN films in this region improves device performance. All three of these applications require the fabrication of high quality (low defect) GaN films which is not adequately addressed in the art.

TABLE 1

TABLE I. Important material properties of Si and various WBG materials for high-power electronic applications

| Property | Si | 3C-SiC | 6H-SiC | 4H-SiC | GaN | Diamond |
|---|---|---|---|---|---|---|
| Bandgap (eV) | 1.12 | 2.3 | 2.9 | 3.2 | 3.39 | 5.6 |
| Electron Mobility (cm$^2$/V-s) | 1450 | 1000 | 415 | 950 | 1000 | 4000 |
| Hole Mobility (cm$^2$/V-s) | 450 | 45 | 90 | 115 | 35 | 3800 |
| Critical Electric Field (V/cm) | $3 \times 10^5$ | $2 \times 10^6$ | $2.5 \times 10^6$ | $3 \times 10^6$ | $5 \times 10^6$ | $10^7$ |
| Saturation Velocity (cm/s) | $10^7$ | $2.5 \times 10^7$ | $2 \times 10^7$ | $2 \times 10^7$ | $2 \times 10^7$ | $3 \times 10^7$ |
| Thermal Conductivity (W/cm-K) | 1.3 | 5 | 5 | 5 | 1.3 | 20 |
| Maximum Operating Temperature (° C.) | 125 | 500 | 500 | 500 | 650 | 700 |
| Dielectric Constant | 11.7 | 9.6 | 9.7 | 10 | 8.9 | 5.7 |

2.4 Definitions

The following definitions are used throughout, unless specifically indicated otherwise:

| TERM | DEFINITION |
|---|---|
| homoepitaxial growth | The growth of a crystalline film on a crystalline substrate wherein the film and the substrate are the same material and the crystal orientation of the crystalline film mimics the crystalline orientation of the substrate |
| heteroepitaxial growth | The growth of a crystalline film on a crystalline substrate wherein the film and the substrate are different materials and the crystal orientation of the crystalline film mimics the crystalline orientation of the substrate |
| domain matching epitaxy | Epitaxial growth of thin films where integral multiples of major crystal lattice planes match across the interface. |

3 SUMMARY OF THE INVENTION

The present invention addresses the problems of the prior art described above by providing a deposition process that operates at considerably lower reaction temperatures as compared to conventional high-temperature deposition processes such chemical vapor deposition (CVD) to avoid the problems of wafer bowing and device layer cracking associated with high temperature heteroepitaxial growth and further allows application of thicker device layers normally prohibited by high temperature heteroepitaxial growth processes which suffer from increased wafer bow and device layer cracking in proportion to the device layer thickness. In particular the present invention utilizes atomic layer deposition (ALD) to deposit group III-V and group II-VI compounds and group III-N compounds directly onto a substantially single crystal silicon substrate surface, e.g. the Si (111) plane using an Atomic Layer Deposition (ALD) film deposition process at a low reaction temperature, e.g. less than 800° C. and preferably less than 400° C., and thereafter thermally annealing the film layer in a manner that causes improvements in the crystal lattice structure to the extent that the improved crystal lattice structure of the deposition film exhibits a lattice structure that is more characteristic of a single crystal lattice structure as determined by X-RAY Diffraction (XRD) analysis. In addition, the present invention utilizes Domain Matching Epitaxy (DME) to at interfaces between dissimilar materials to further alleviate problems associated with crystal lattice spacing mismatches associated with heteroepitaxial growth.

These and other aspects and advantages will become apparent when the Description below is read in conjunction with the accompanying Drawings.

4 BRIEF DESCRIPTION OF THE DRAWINGS

The features of the present invention will best be understood from a detailed description of the invention and example embodiments thereof selected for the purposes of illustration and shown in the accompanying drawings in which.

4.1 ITEM NUMBER LIST

Figure 1A:
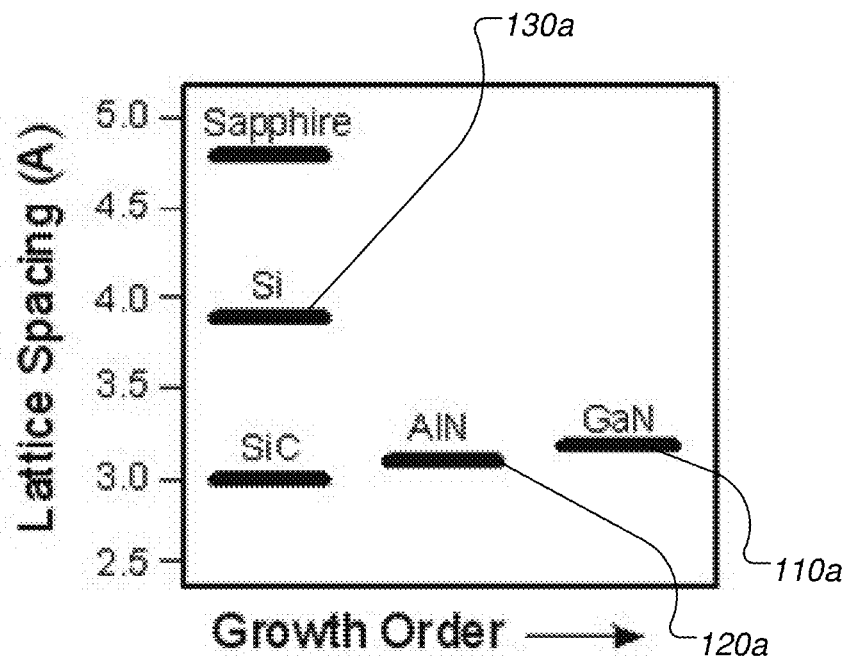
FIG. 1a is a plot illustrating variation of the (in-plane) lattice spacing in Angstroms for the growth of wurtzite-GaN on various substrates with an AlN interlayer according to one aspect of the present invention.
Figure 1B:
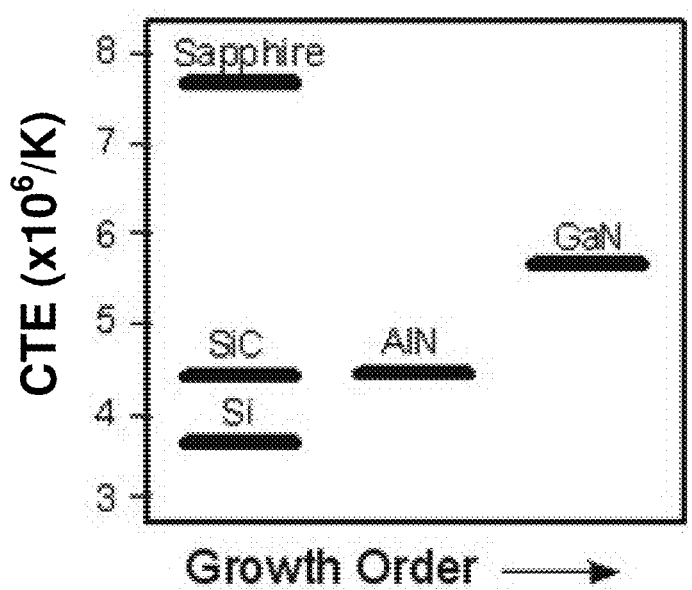
FIG. 1b is a plot illustrating variation of the thermal expansion coefficient of GaN as compared to substrate materials and an AlN interlayer according to one aspect of the present invention.

The following item numbers are used throughout, unless specifically indicated otherwise.

| # | DESCRIPTION |
|---|---|
| 100 | |
| 110a | GaN lattice spacing |
| 120a | AlN lattice spacing |
| 130a | Si lattice spacing |
| 200 | ALD system |
| 210 | ALD Chamber |
| 222a | ALD Pulse Valve |
| 222b | ALD Pulse Valve |
| 222c | ALD Pulse Valve |
| 222d | ALD Pulse Valve |
| 230 | Carrier gas reservoir/supply |
| 234 | Carrier gas line (vapor draw) |
| 236a | Carrier gas line |
| 236b | Carrier gas line |
| 236c | Carrier gas line |
| 236d | Carrier gas line |
| 240a | Precursor cylinder |
| 240b | Precursor cylinder |
| 240c | Precursor cylinder |
| 240d | Precursor cylinder |
| 260 | Exhaust line |
| 262 | Main vacuum valve |
| 266 | Electronic controller |
| 270 | Heater sensor module |
| 276 | Trap Module |
| 278 | Pressure sensor |
| 280 | Vacuum pump |
| 300 | Laser Annealing Process |
| 302 | Recipe |
| 310 | Laser |
| 320 | Remote optics |
| 322 | FAB level optics |
| 324 | Laser Beam |
| 330 | MCT detector |
| 340 | CMOS Camera |
| 350 | Detector focus |
| 352 | Multiple λ emission detector |
| 362 | X-Y Stage |
| 364 | Hot chuck |
| 366 | Substrate |
| 370 | Temperature algorithm |
| 390 | Line beam |
| 410 | Temperature vs. Time curve of Si Wafer |
| 412 | Initial Temperature |
| 414 | Peak Temperature |
| 416 | Cooled Temperature |
| 500 | AlN/Si System |
| 520 | AlN layer |
| 530 | Si layer |
| 540 | Misfit dislocation |

-continued

| # | DESCRIPTION |
|---|---|
| 600 | GaN-on-Si film structure |
| 610 | GaN layer |
| 620 | AlN layer |
| 630 | Si substrate |
| 640 | Misfit dislocation |
| 645 | AlN/Si interface |
| 615 | $Al_xGa_{1-x}N$ transition layer |
| 660 | Thermograph |
| 675 | substrate |
| 680 | Laser beam |
| 710 | Maximum allowable bow |
| 720 | 250° C. deposition |
| 730 | 1050° C. deposition |
| 800 | GaN-on-Si film with release layer structure |
| 810 | GaN film layer |
| 811 | Top layer of GaN film |
| 815 | $Al_xGa_{1-x}N$ transition layer |
| 820 | First AlN layer |
| 822 | Second AlN layer |
| 830 | Si substrate |
| 845 | Si-AlN interface |
| 847 | AlN-BN interface |
| 849 | BN-AlN interface |
| 850 | h-BN (release) layer |
| 900 | Solid state device |
| 905 | Si Substrate |
| 910 | AlN nucleation layer |
| 915 | GaN device layer |
| 1000 | Vertical device architecture |
| 1005 | GaN device layer |
| 1010 | Carrier substrate |
| 1015 | source |
| 1020 | gate |
| 1025 | drain |

5 DESCRIPTION OF SOME EMBODIMENTS OF THE INVENTION 5.1 Exemplary System Architecture According to one aspect of the present invention Atomic Layer Deposition (ALD) is used to deposit thin films onto planar and non-planar silicon substrate surfaces in processes related to the manufacture of solid state electronic devices. According to one aspect of the present invention ALD deposition film growth or film deposition described herein is preferably conducted at reaction temperatures ranging from 80-400° C. wherein substrates are housed in a reaction chamber and maintained below atmospheric pressure e.g. at a pressure ranging from 1-500 mTorr (milli-torr) during the film deposition process. Notwithstanding the desirability to limit ALD reaction temperatures to the preferred range of 80-400° C., ALD reaction temperatures ranging from 80-800° C. may be used without deviating from the present invention. Specifically, the reaction temperature means the temperature of the substrate being deposition coated and the temperature of the deposition environment such as the reaction chamber walls and substrate support elements. Preferably the reaction temperature remains constant during a given atomic layer deposition cycle, which includes depositing a plurality of monolayers of a first material, e.g. AlN onto the substrate. However, a different reaction temperature may be used for a different atomic layer deposition cycle, such as while depositing a plurality of monolayers of a second material, e.g. GaN onto the same substrate. Thus, the deposition temperature range may apply to different deposition temperatures used to apply different material layers onto the same substrate during a single uninterrupted material processing event.

Additionally, while the present invention is described in terms of heteroepitaxial growth the low temperature ALD combined with other aspects of the present invention are usable for homoepitaxial growth without deviating from the present invention. Thus, in comparison with conventional heteroepitaxial growth and specifically with GaN and AlN film growth on single crystal sapphire by Metal Organic Chemical Vapor Deposition (MOCVD) at (900 to 1100° C.) the ALD deposition film growth of the present invention and particularly growth of GaN and AlN films on single crystal silicon is conducted at lower reaction temperatures e.g. 80-800° C. and still further lower temperatures e.g. 80-400° C. in preferred deposition processes. Accordingly, the low reaction temperature of the present invention avoids many of the problems of high temperature film growth such as device layer and substrate damage due to thermal cycling, wafer bow due to thermal cycling, poor surface properties or morphology and diffusion of surface film components into the substrate material, all of which have been reported as problematic in prior art publications.

According to a further aspect of the present invention film layer interfaces are specifically selected to take advantage of Domain Matching Epitaxy (DME). In particular, in one example embodiment AlN is grown on a Si(111) substrate. The AlN layer is used as a buffer or nucleation layer and is deposited by a low temperature ALD deposition process. In this example embodiment each fourth silicon (220) plane has substantially matched lattice spacing with each fifth aluminum nitride (21-1-0) plane which induces crystalline growth having a desired lattice orientation in the AlN deposition layer at least where the lattice spacing of the AlN and the Si are matched. Thereafter the AlN buffer layer is laser annealed using a rapid and local increase in surface temperature to more than about 900° C. using systems and methods described below. The laser annealing step locally and very briefly heats each portion of the deposition layer to a temperature suitable for crystal lattice structure reorientation which tends to reorient the crystal structure of most of the AlN layer to match the desired lattice orientation.

According to a further non-limiting example embodiment, a $Al_xGa_{1-x}N$ transition layer is applied over the AlN buffer or nucleation layer or in some cases directly onto the silicon substrate by one or more by a low temperature ALD deposition processes. In particular the $Al_xGa_{1-x}N$ transition layer comprises a plurality of material layers wherein each material layer has a different material composition. Each different material layer of the transition layer is applied by a different low temperature ALD process. The composition of each different material layer transitions from AlN or nearly AlN toward GaN or nearly GaN. Thus, the transition layer provides a gradual shift in material composition from AlN to GaN with each different material layer having a different CTE and different crystal lattice spacing. The effect is that each different material layer reduces the CTE and crystal lattice spacing mismatch between the AlN buffer or nucleation layer and a GaN layer being applied over the transition layer.

In one non-limiting example embodiment the buffer layer comprises AlN. The transition layer includes four different material layers each having a different material composition. The transition layer first material layer has a composition of $Al_{0.9}Ga_{0.1}N$ which is nearly all AlN. The transition layer second material layer has a composition of $Al_{0.7}Ga_{0.3}N$. The transition layer third layer has a composition of $Al_{0.4}Ga_{0.6}N$ and the transition layer fourth layer has a composition of $Al_{0.1}Ga_{0.9}N$, which is nearly all GaN. At the interface between AlN buffer layer and the first material of the transition layer the crystal lattice spacing mismatch and the CTE mismatched between the two dissimilar materials is smaller than the crystal lattice spacing mismatch and the CTE mismatched between AlN and GaN. This is also true for each of the different material interfaces of the transition layer and of the material interface of the transition layer and the GaN layer applied over the transition layer. The net effect is that the transition layer provides a smaller crystal lattice spacing mismatch and a smaller CTE mismatch at dissimilar material interfaces which supports single crystal growth and reduces the likelihood of surface cracks due to temperature gradients.

In the above described non-limiting example transition layer ALD deposition cycle each different material layer of the $Al_xGa_{1-x}N$ transition layer may laser annealed after it is applied to reorient its crystal structure. Alternately the entire $Al_xGa_{1-x}N$ transition layer may applied in full before it is laser annealed to reorient the crystal structure of the entire transition layer in a single laser annealing step.

In a further non-limiting example embodiment an AlN buffer or nucleation layer is grown on a Si(111) substrate by a low temperature ALD deposition process and thereafter a GaN device layer is grown directly onto the AlN buffer layer by a second low temperature ALD deposition process. In various process embodiments the AlN layer may be laser annealed in-situ before the application of the GaN layer and the GaN device layer may be laser annealed in-situ or ex-situ. In either case the in-situ laser annealing step may be performed after the entire layer thickness is applied or at intervals during the layer thickness application e.g. after each monolayer or AlN or GaN is applied, after each 10 monolayers of the material being applied, or the like. Alternately a single laser annealing step may be used to anneal the combined AlN nucleation layer and GaN device layer at the same time and the single laser annealing step is performed ex-situ.

According to a further aspect of the present invention deposition film layers are laser annealed after deposition by the low temperature ALD deposition processes. Without being bound to a particular theory it is believed that the laser annealing step reorients the crystal lattice structure. In particular deposition films processed by the laser annealing the deposition layer tend to more closely matches single crystal structure characteristics as determined by X-ray diffraction analysis. In various non-limiting process embodiments, an ex-situ laser annealing step may be performed once on the final device layer or an in-situ laser annealing step may be performed once on each deposition layer after the application of the full layer thickness or by combinations of in-situ and ex-situ laser annealing steps at various points in the deposition process. In particular, the laser annealing step locally and very briefly heats each portion of the deposition layer to a temperature suitable for crystal lattice structure reorientation by point-wise or line-wise scanning a focused laser beam over the entire area of the substrate. In one example embodiment, the deposition layer or layers are heated to above 1300° C. for about 800 μs while the substrate is marinated at about 400° C. The laser bean has a 140 μm width or diameter and the laser wavelength ranges from 300-1000 nm range.

More generally the present invention is directed to growing films comprising group III-V and group II-VI compounds and specifically group III-N compounds onto a substantially single crystal silicon substrate surface using ALD film deposition at a low reaction temperature, e.g. less than 800° C. and preferably less than 400° C., and thereafter thermally annealing the film layer in a manner that causes improvements in the crystal lattice structure of the deposited film to the extent that the improved crystal lattice structure of the deposition film exhibits a lattice structure that is more characteristic of a single crystal lattice structure as determined by X-Ray Diffraction (XRD) analysis. Additionally, the present invention includes applying a plurality of different film compositions comprising group III-V and group II-VI compounds and specifically group III-N one above another and arranged in a manner that reduces crystal lattice mismatch and or CTE mismatch between adjoining material layers. Additionally, selection of which adjoining material layers to apply employs Domain Matching Epitaxy. In particular, in preferred embodiments adjoining materials are matched in a manner that allows periodic non-adjacent crystal lattice spacing matches to initiate single crystal growth induced at the periodic non-adjacent crystal lattice spacing matches. Additionally, one or more laser annealing steps are performed to reorient crystal lattice structure to more closely match single crystal structure as determined by X-RAY Diffraction (XRD) analysis.

5.2 ALD Device and Methods

Figure 2:
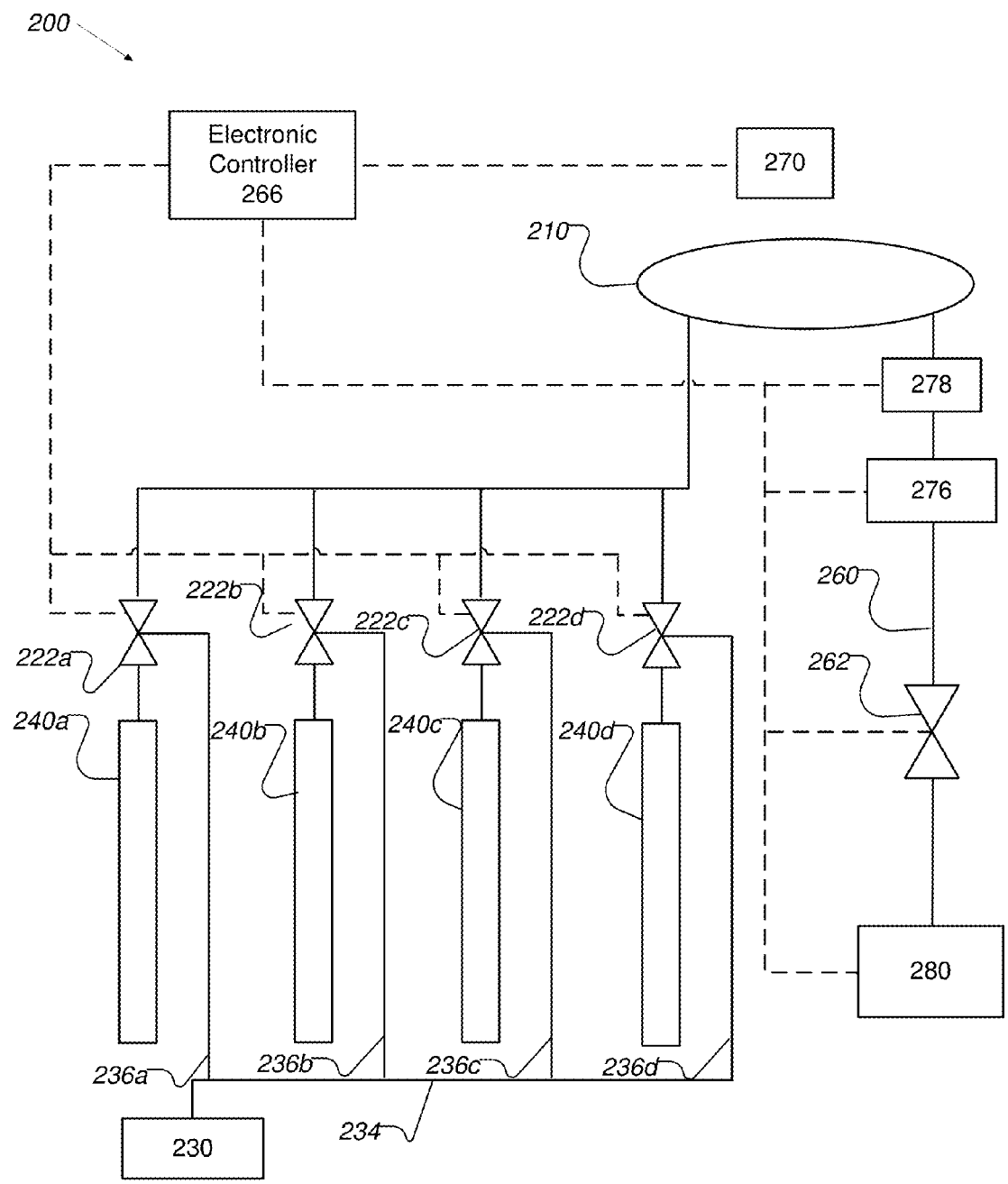
FIG. 2 depicts an exemplary schematic diagram of an ALD system according to one aspect of the present invention.

Referring now to FIG. 2 one non-limiting example ALD system (200) is shown schematically. The ALD system (200) comprises an ALD chamber (210) for receiving one or more substrates therein and delivering process gases therein in a manner that causes thin film material layers to be deposited onto exposed substrate surfaces by a gas or vapor deposition process. The ADL chamber may include integral or removable substrate support surfaces, not shown, for supporting one or more substrates thereon during the gas or vapor deposition cycle. The ALD chamber includes one or more manually or automatically operated substrate access ports, not shown, operable to insert and remove substrates manually or by automated mechanisms and sealable when closed to provide a vacuum seal. In one non-limiting example embodiment, the ALD chamber (210) is configured to support one or more 100 mm, 200 mm and or 300 mm wafer substrates, e.g. single crystal silicon wafers, for simultaneous processing. One example of such an ALD chamber is described in commonly assigned U.S. Pat. No. 8,202,575 to Monsma et al. dated Jun. 19, 2012 entitled VAPOR DEPOSITION SYSTEMS AND METHODS. In another non-limiting example embodiment, the ALD chamber (210) is configured to support one or more rectangular substrates e.g. glass substrates ranging in size from GEN 1.0 to GEN 4.5, e.g. up to 920 mm×730 mm, for simultaneous processing. One example of such an ALD chamber is described in commonly assigned US Pat. Appl. Pub. No. 2012/0064245 to Becker et al. dated Mar. 15, 2012 entitled ALD SYSTEMS AND METHODS and in commonly assigned US Pat. Appl. Pub. No. 2010/0247763 to Coutu et al. dated Sep. 30, 2010 entitled REACTION CHAMBER WITH REMOVABLE LINER and further in commonly assigned US Pat Appl. Pub. No. 2010/166955 to Becker et al. dated Jun. 1, 2012 entitled SYSTEM AND METHOD FOR THIN FILM DEPOSITION; all three of which are incorporated by reference herein in their entirety.

The ALD chamber is preferably maintained at a reaction temperature and pressure during the gas or vapor deposition process. Accordingly, a heater and thermal sensor module (270) is provided to heat and maintain the ALD chamber to the desired reaction temperature under the control and monitoring of the electronic controller (266) which is electrically interfaced to the heater and thermal sensor module (270). Additionally, a vacuum system (280) is provided to evacuate the ALD chamber (210) to remove potential contaminates, e.g. moisture, and to maintain the desired reaction pressure which preferably ranges from 1-500 mtorr (millitorr). The vacuum system (280) removes exhaust gases from the ALD chamber (210) through an exhaust line (260) connected to a vacuum pump (280) which preferably operates continuously and is controlled and monitored by the electronic controller (266). The exhaust line includes a pressure sensor module (278), a trap or filter module (276) and a vacuum valve (262) each controlled and or monitored by the electronic controller (266). The sensor module senses gas pressure in the exhaust line (260) or in the ALD chamber (210) and sends a pressure signal to the electronic controller (266). The trap module (276) is disposed along the exhaust line (260) to receive exhaust gasses there through and functions to remove unreacted precursor gas and in some cases reaction bi-product from the exhaust flow exiting from the ALD chamber (210). The trap module is preferably heated to or nearly to the reaction temperature maintained inside the reaction chamber by local trap heaters, not shown, and its temperature may be actively sensed by thermal sensors, not shown, in communication with the electronic controller (266). Alternately sufficient heating of the trap module (276) may be provided by thermal energy transferred from the ALD chamber (210) and or the process gases passing through the trap module. The vacuum valve (262) is operably controlled by the electronic controller (266) to open and close as needed and may be closed to extend the exposure time of a process gas to the substrate.

Process gasses including at least two different precursors are stored in separate gas cylinders, e.g. (240a, 240b, 240c, 240d). The precursor gases are separately fed to the ALD chamber (210) by modulating individual pulse vales (222a, 222b, 222c, 222d). In one non-limiting embodiment pulse valves are disposed between each gas cylinder and the ALD chamber. A pulse valve is activated by the electronic controller (266) in order to deliver a single pulse of a particular precursor material into the ADL chamber in a manner that ensures that dissimilar precursor gases are not mixed either in the gas input lines or the ALD chamber (270). Process gas heaters and thermal sensors in communication with the electronic control module (226) may be provided to heat and maintain process gases at or close to the reaction temperature. The electronic controller (266) is programmed to operate the pulse valves as required to inject measured volumes (pulses) of precursor gas into the ALD chamber each time a pulse valve is actuated. Gas pulses may be carried into the ALD chamber by an inert carrier gas such as a noble gas or nitrogen which is supplied from a carrier gas source (230) and delivered to each pulse valve by delivery conduit (234) and (236a-236d). In other non-limiting embodiments, the precursors may comprise a liquid or solid precursor material and a gas bubbler or the like, not shown, may be provided between liquid or solid precursor supply containers and the pulse valve to extract gas or vapor from liquid or solid precursor material and to increase the vapor pressure of low vapor pressure precursor materials. Accordingly some gas cylinders (240a, 240b, 240c, 240d) may alternately comprise liquid or solid precursor containers as required.

The electronic controller (266) includes operating software and programs stored in memory and a digital data processor collectively configured to automatically run one or more ALD coating process cycles initiated by an operator or by a higher-level process control system. Additionally, the electronic controller monitors and controls various sub-modules as required to maintain the reaction temperature and pressure and deliver process gas pulses as needed according to a user selected material deposition menu. In addition, the ALD chamber (210) may include one or more sensors (270) associated with monitoring the coating process such as with measuring physical properties of the deposition layers and or of the process gasses as may be suitable.

According to one non-limiting embodiment of the present invention the ALD system (200) is used to deposit one or more group III-V compounds (e.g. comprising Boron, Aluminum, Gallium, Indium and Thallium) and or one or more group II-VI compounds (e.g. comprising Cadmium and Zinc) and specifically group II-N compounds comprising GaN, and AlN and InN onto a silicon substrate and preferably silicon substrate formed with the Si(111) atomic plane exposed for deposition of device layer materials. More specifically the ALD coatings are applied to the Si (111) atomic plane using an ALD reaction temperature that is less than the reaction temperatures used in MOCVD and less than reaction temperatures normally associated with heteroepitaxial growth. In particular, the present invention sequentially applies monolayers of group I-V, group II-VI and preferably group III-N compounds onto a substantially single crystal silicon wafer using an ALD reaction temperature below about 800° C. and a preferred using an ALD reaction temperature ALD reaction temperature range of 80-400° C.

In a more specific non-limiting embodiment of the present invention the ALD system (200) is used to deposit a first material layer comprising an aluminum nitride (AlN) monolayer onto exposed surfaces of a silicon substrate and preferable the Si (111) atomic plane by an ALD process sequence. Such an ALD process sequence is disclosed in commonly assigned related U.S. Provisional Appl. Ser. No. 61/842,207 filed Jul. 2, 2013 entitled DEPOSITION AND PROCESSING METHODS FOR GROWING GALLIUM NITRUDE AND ALUMINUM NITRIDE ON SILICON. The ALD process sequence includes reacting a first precursor with exposed substrate surfaces wherein the first precursor is trimethylaluminum (TMA), TDMAA, or any other metal-organic Al precursor, or a halogenated Al precursor. The first precursor is then purged from the reaction chamber and a second is reacted with the exposed substrate surfaces and the second precursor is ammonia ($NH_3$), or ($N_2H_2$), $N_2$, $N_2$—$H_2$ ratio mixture, monatomic Nitrogen, or monatomic Hydrogen, or any combination of monatomic Nitrogen and monatomic Hydrogen, or any other nitrogen or hydrogen containing co-reactant. After the second reaction is complete the second precursor is purged form the reaction chamber and a first mono layer of aluminum nitride (AlN) is formed.

Additionally an aluminum nitride AlN monolayer can be grown onto silicon using plasma enhanced atomic layer deposition (PEALD) process. In a preferred process embodiment additional single aluminum nitride AlN monolayers are applied in sequence each requiring a single coating cycle, utilizing the two reactions described above, and the coating cycles are repeated until a desired combined monolayer thickness of AlN is achieved, which may be between about 10 and 2000 A with each single mono layer having a thickness of about 0.5 to 2 A. One suitable example PEALD device is disclosed in commonly assigned US Pat. Appl. Pub. No. 201000183825 to Becker et al. dated Jul. 22, 2010 entitled PLASMA ATOMIC LAYER DEPOSITION SYSTEM AND METHOD which is incorporated herein by reference.

While the above described AlN layer can be readily applied onto the silicon substrate by an ALD gas deposition process the reaction temperature is well below what is conventionally associated with heteroepitaxial growth. Accordingly the AlN material layer of the present invention would not be expected to be suitable as a device quality layer in that while an X-Ray diffraction analysis of the layer may show some desirable uniform single crystal lattice growth i.e. characterized by significant same crystal lattice orientation, the presence of other non-desirable crystal lattice orientations and noise related to poly crystalline and amorphous regions of the in the monolayer would be expected due to the low reaction temperature.

More generally the ALD system (200) is operable to process batches of 1 or more small substrates, e.g. 100-300 mm, as well as batches of one or more large substrates, e.g. silicon compounds, such as glass, up to 1.2 m square at vacuum pressures with sub-second mono layer cycle times. Generally, the ALD system (200) provides precise layer thickness control without having to actually measuring the layer thickness and is operated to process batches y repeating from about 2-1000 monolayer applications in an unattended batch cycle. Additionally ALD precursor materials are available that are suitable for the deposition of element monolayers of group III-V, group II-VI and group III-N materials on silicon or on non-silicon substrates or onto previously allied monolayers as well as compound layers comprising group III-V, group II-VI and group III-N materials either in combination with other group III-V, group II-VI and group III-N materials or in combination with other materials such as ZnOS, (a combination of ZnO and ZnS) on silicon or non-silicon substrates or on previously applied monolayers.

5.3 Domain Matching Epitaxy (DME) and Nucleation Layer

According to a further aspect of the present invention specific deposition layer materials are matched to the substrate and or to a previously applied deposition layer in a manner that tends to induce single crystal growth in the newly applied deposition layer even though the reaction temperature of the layer deposition is well below what is conventionally associated with temperatures suitable for inducing heteroepitaxial growth. More specifically the material layers are matched to take advantage of Domain Matching Epitaxy which allows epitaxial growth of thin films on substrates that have a large crystal lattice mismatch by selecting material combinations where matching domains or major crystal lattice planes occur at integral multiples of the major lattice crystal lattice planes.

In one specific non-limiting example embodiment, according to the present invention an AlN buffer or nucleation layer is deposited onto a crystalline silicon substrate having the Si (111) crystal lattice plane exposed for AlN deposition thereon by an ALD deposition process with a reaction temperature of less than 400° C. In this example embodiment, Domain Matching Epitaxy dictates that every fourth silicon (220) plane has substantially matched lattice spacing with every fifth aluminum nitride (21-1-0) plane and that single crystal growth is induced at each point where the lattice spacing is substantially matched. In other words, where the material layer combination can provide a small lattice spacing mismatch even at a limited number of lattice points the likelihood of single crystal nucleation is increased and once nucleated, the likelihood of further single crystal growth is increased.

In the specific example of AlN/Si the matching is called 4/5 matching since every fourth silicon (220) plane matches with every fifth aluminum nitride (21-1-0) plane. In another non-limiting example embodiment, according to the present invention, ALD is used to apply a Titanium Nitride nucleation layer on silicon due to the 3/4 matching of TiN/Si. In further non-limiting embodiments of the present invention DME is usable to match the nucleation layer with the device layer without having a DME match between the substrate and the nucleation layer. In one specific non-limiting embodiment, a nucleation layer of Yttrium oxide ($Y_2O_3$) is deposited onto a Si (111) substrate by a low temperature ALD deposition process and a layer of zinc oxide ($ZnO_2$) is applied over the yttrium oxide layer. In the specific example of $ZnO_2/Y_2O_3$ the matching is 7/6 matching since every seventh zinc oxide (112-0) plane with every sixth yttrium oxide (44-0) plane.

According to further aspects of the present invention a low reaction temperature, 80-400° C. is used to minimize thermal stress induced by CTE mismatches between dissimilar materials. Additionally, deposition film layers are applied in a specific sequence and the layers are formed with specific material compositions to minimize the normally detrimental effects of CTE mismatches at dissimilar material or crystal structure interfaces.

Figure 3:
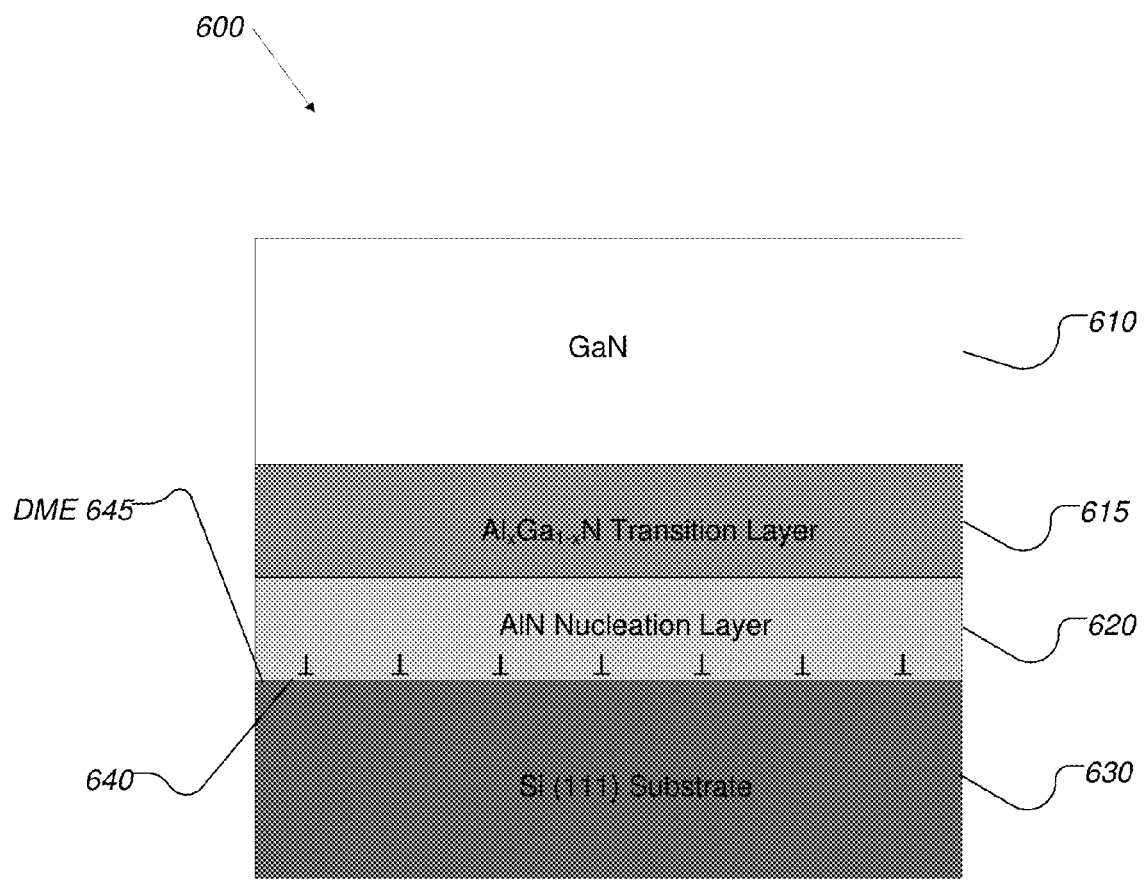
FIG. 3 depicts an exemplary schematic diagram of a material layer structure for providing a gallium nitride device layer on a silicon substrate according to the present invention.

Referring to FIG. 3, in one example non-limiting embodiment of the invention a nucleation or boundary layer comprising AlN (620) is deposited onto the Si (111) atomic plane of a substantially single crystal silicon wafer substrate (630) in the ALD chamber (210) using a multi-monolayer ALD deposition process. In the present example, each monolayer of AlN is applied by reacting a first precursor, trimethylaluminum (TMA) with the Si substrate. Alternately the first precursor may comprise TDMAA, or any other metal-organic Al precursor, or halogenated Al precursor. The first precursor is then purged from the reaction chamber and a second is reacted with the exposed substrate surfaces. The second precursor is ammonia ($NH_3$), ($N_2H_2$), $N_2$, $N_2$—$H_2$ ratio mixture, monoatomic Nitrogen, or monoatomic Hydrogen, or any combination of monoatomic Nitrogen and monoatomic Hydrogen, or any other nitrogen or hydrogen containing co-reactant. After the second reaction is complete the second precursor is purged from the reaction chamber and a first monolayer of aluminum nitride (AlN) is formed. Alternately, an aluminum nitride AlN monolayer can be grown onto silicon using a PEALD process. In one non-limiting embodiment the thickness of the boundary layer is between 10 and 1000 nm.

As described above the AlN nucleation layer is domain matched with silicon such that integral multiples of the lattice planes of each material are commensurate across the material interface boundary. In particular, the nucleation layer of AlN (a=3.11 Å) on the Si (111) substrate (a=3.89 Å) has a 5-to-4 integral matching. As a result, a regular array of misfit dislocations is nucleated within the first monolayer in the AlN. The misfit dislocations occur at every fifth lattice plane to accommodate the lattice mismatch, and the registration of the integral domains provides the necessary strain relief to initiate single crystal growth in the AlN layer. An example micrograph of the interface boundary between an Si substrate and a AlN nucleation layer is shown in FIG. 4 which includes a diffraction pattern image in the lower right hand corner showing that the AlN layer exhibits the characteristics of single crystal orientation.

Figure 4:
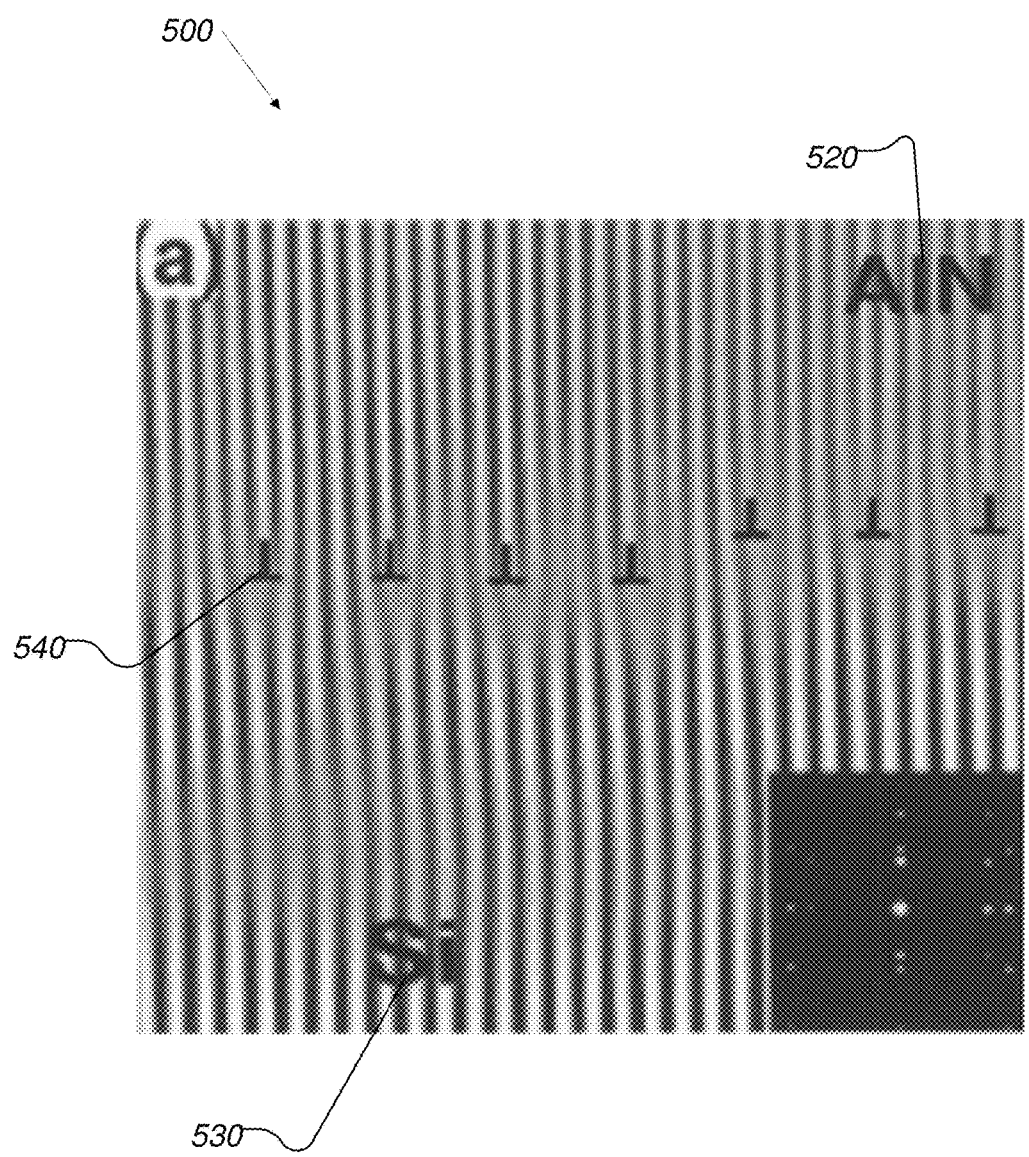
FIG. 4 depicts an example high-resolution cross-section in the AlN/Si(111) system and corresponding inserted diffraction pattern showing the alignment of AlN (2110) and Si(220) planes according to the present invention.

Referring to FIG. 4 an example cross-section of the boundary between the Si (111) substrate (where the atomic spacing is a=3.89 Å) and the AlN nucleation layer (where the atomic spacing is a=3.11 Å) shows matching of the AlN (2110) planes (520) and the Si(220) planes (530) with a regular array of misfit dislocation (540) occurring at every fifth plane. More importantly in spite of the nearly 19% crystal lattice mismatch between AlN (2110) and Si (111), the mismatch at the misfit dislocations (540) is much smaller and small enough to locally induce single crystal growth of the AlN nucleation layer. More importantly the micrograph shows substantially defect free AlN crystallization above the layer interface and this confirmed by the X-Ray diffraction image shown in the lower right hand corner.

Figure 9:
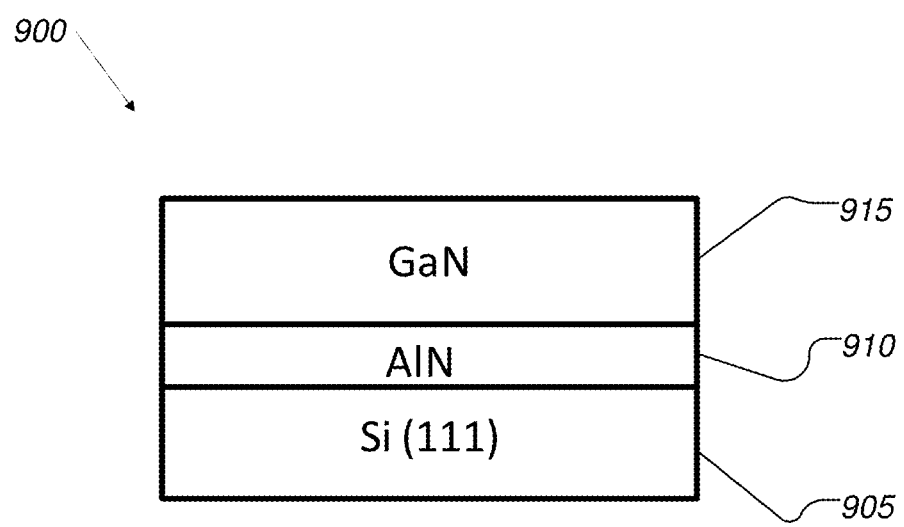
FIG. 9 is an exemplary schematic diagram depicting a gallium nitride device layer arranged in vertical device architecture according to the present invention.

Referring now to FIG. 9 one non-limiting example device structure (900) according to the present invention comprises a silicon substrate (905) with an AlN nucleation layer (910) deposited on the Si (111) plane of the Si substrate using a reaction temperature of less than 400° C. The device (900) further includes a GaN device layer (915) deposited onto the AlN nucleation layer (910) using a reaction temperature of less than 400° C. In the present example, the AlN layer thickness ranges from 10-1000 nm and the device layer thickness ranges from 100-3000 nm.

Referring to FIG. 3 another non-limiting example device structure (600) according to the present invention comprises a silicon substrate (630) with an AlN nucleation layer (620) deposited on the Si (111) plane of the Si substrate using a reaction temperature of less than 400° C. A transition layer (615) is deposited onto the nucleation layer (620) between the nucleation layer (620) and a GaN device layer (610) and a device layer (610) comprising GaN is deposited onto the transition layer (615) using a reaction temperature of less than 400° C.

The transition layer (615) comprises at least one layer comprising an $Al_xGa_{1-x}N$ compound deposited into the AlN nucleation layer by an ALD deposition method using a reaction temperature of less than 400° C. In particular, the at least one transition layer comprises a material that has at least one property that is more suitable for inducing heteroepitaxial growth of the GaN layer than the nucleation layer (620). More specifically the material composition of the nucleation layer is selected to reduce either the CTE mismatch or the crystal lattice spacing mismatch between the nucleation material (AlN) and the device material (GaN) or both. In another non-limiting example embodiment, the transition layer (615) comprises a plurality of different material layers each comprising a $Al_xGa_{1-x}N$ compound wherein the composition is continuously varied from AlN to GaN such that the upper most transition layer material provides the most suitable template for heteroepitaxial growth of the GaN layer (610).

5.4 Laser Annealing

Figure 5:
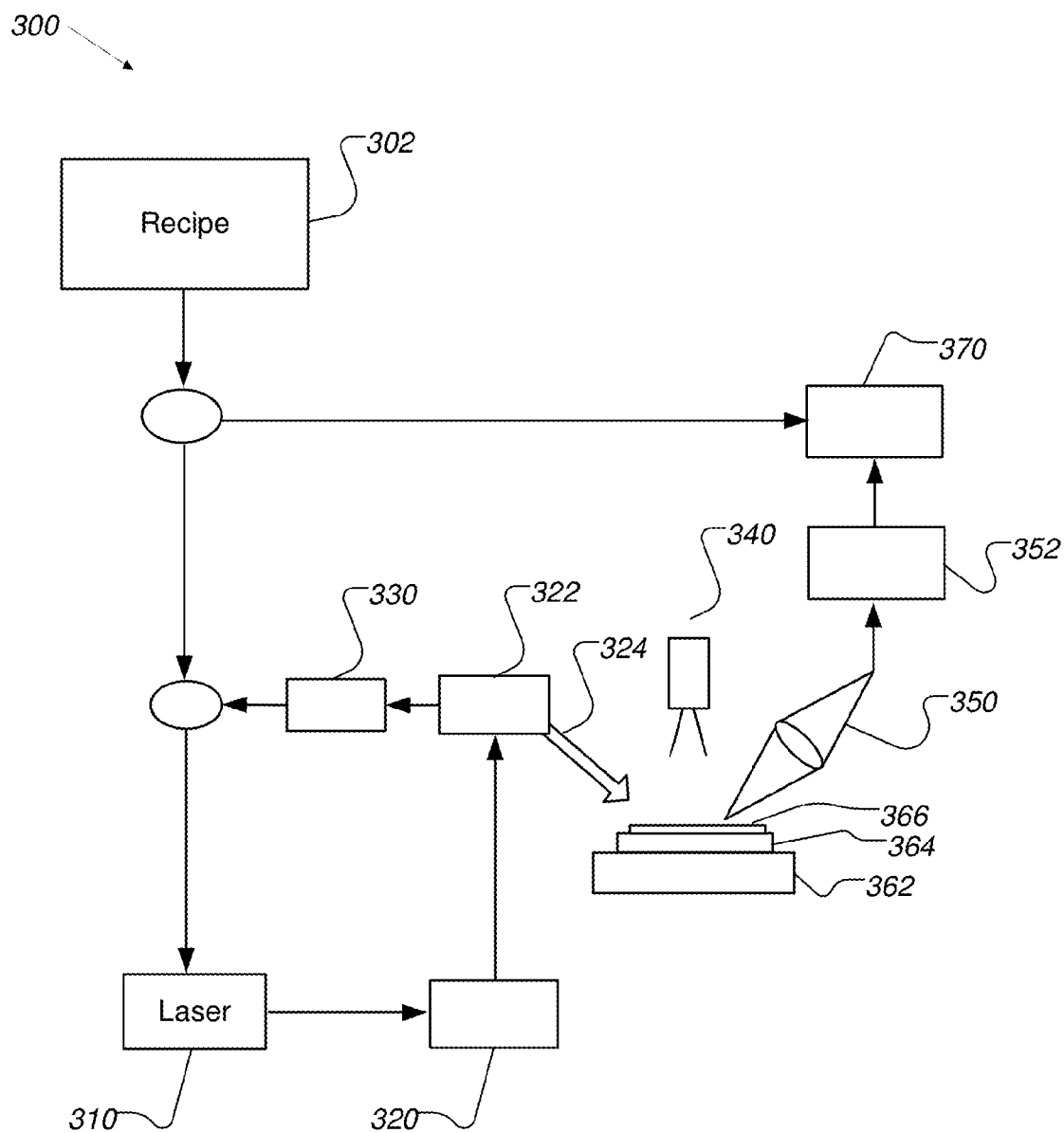
FIG. 5 depicts an exemplary schematic diagram of the laser spike annealing (LSA) system according to the present invention.

Referring now to FIG. 5 a schematic view of on non-limiting example laser annealing system (300) incorporated with an ALD reaction chamber. The laser annealing system includes a linear or rotary motion stage (362) interfaced with a hot chuck or substrate support (364). The substrate support resides inside the ALD chamber (210) described above. The rotary motion stage may (362) may reside indie or outside the ALD reaction chamber as long the stage is capable of moving the substrate with respect to a fixed laser annealing beam. More generally any device that provides relative motion between a laser annealing beam and the substrate is usable without deviating from the present invention. The substrate support (364) and coated substrate (366) are housed inside the ALO chamber and are simultaneously movable in response to motion of the motion stage (362). Alternately the motion stage (362) is disposed between the substrate support (364) and the substrate (366) such that only the substrate is moved by the motion stage (364). The motion stage is controlled by an electronic controller (302) which controls the motion the stage (362) and other systems during laser annealing operations.

In one non-limiting example embodiment, a stationary laser beam (324) is directed onto the substrate (366) as the substrate is moved with respect to the laser beam. In other embodiments, the substrate is stationary and the laser beam is scanned over the substrate surface. The laser annealing beam may comprise a focused line or linear beam or a focused circular beam. The linear laser beam (324) is generated by a system which includes a laser (310), remote optics (320) FAB level optics (322), a laser radiation sensor (330) and various control elements in communication with the electronic controller (302).

In one example embodiment, the optical systems precisely focus a linear laser beam (324) along a linear axis of the substrate of the substrate (362) coating surface. In addition, the optical systems provide a substantially homogeneous luminous intensity across the length of the linear laser beam to uniformly heat the substrate surface. In particular, the linear length of the linear laser beam (324) substantially exceeds one linear dimension of the substrate (366) such that relative motion between the substrate and the linear laser beam illuminates the entire area of the substrate (366).

In another example embodiment, the optical systems precisely focus a linear laser beam (324) to a point source (e.g. having a circular Gaussian energy distribution) directed onto the substrate (362) coating surface. In this example the optical systems includes a raster scanning systems capable of one or two axis raster scanning for scanning the laser beam over the entire area of the substrate. In one embodiment, a single axis raster scanner scans the point laser beam across one linear axis of the substrate while motion stage moves the substrate along a perpendicular linear axis. In any event, relative motion between the substrate and the point source laser beam illuminates the entire area of the substrate (366).

In a non-limiting example embodiment, the laser (310) is a continuous wave CW laser having laser radiation output at a wavelength that is readily absorbed by silicon, e.g. ranging from 300-1000 nm and in one example embodiment the laser (310) comprises a 200 Watt green fiber laser. Other lasers including non-CW lasers and non-fiber lasers are usable without deviating from the present invention.

The laser beam is controlled by various sub-systems to anneal the substrate coating surface by heating the surface to an annealing temperature. In particular laser radiation is used to thermally excite the coating layer or layers in order to activate local atomic relaxation in the coating layers. Without being bound by a particular theory, Applicants believe that the thermal energy resulting from laser radiation directed onto the coating layer heats the coating layer to high enough temperature to allow atoms of the coating layer to rearrange into more suitable crystal lattice structure substantially matching the crystal lattice structure normally achieved by high temperature heteroepitaxial growth such as may result when heteroepitaxial coating layers are applied by conventional MOCVD processes. However, unlike conventional MOCVD processes wherein the entire substrate and coating layer are simultaneously heated and cooled together; the present invention provides only localized heating which is quickly dissipated three dimensionally away from the laser beam without inducing localized thermal stress between dissimilar materials as they expand and contract at different rates during thermal cycling. Moreover, those skilled in the art will recognize that the same principals of the present invention are also applicable to homoepitaxial growth at low reaction temperatures.

The present invention includes the above described laser annealing system to anneal material layers applied onto substrates and or applied onto other deposition layers in order to achieve substantially epitaxial crystal lattice growth of the material layers. The annealing temperature is between about 1200 and 1500° C. The temporal duration or dwell time (e.g. the laser pulse half width duration) of the annealing temperature is between about 400 and 2000 μs. The laser energy is a focused beam linear beam having a focused line width at the deposition surface of about 140 μm. The linear beam has a longitudinal length that exceeds the largest dimension of the largest substrate being scanned. The wavelength of the laser energy is preferably readily absorbed by silicon which includes a wavelength range of 300 to 1000 nm. A preferred laser wavelength is green having a narrow spectral output centered between about 515 and 580 nm. In one example embodiment the laser (310) comprises an erbium and ytterbium fiber laser having a narrow spectral band output centered at 532 nm with a Continuous Wave (CW) output power between 50 and 500 watts and preferably 200 watts. Alternately the laser (310) may comprise a neodymium yttrium aluminum garnet (Nd Y AG) laser having a narrow spectral band output centered at 532 nm.

The laser beam is controlled by various sub-systems to anneal the substrate coating surface by rapidly heating the surface to an annealing temperature. In particular laser radiation thermally excites the substrate coating surface and specifically the deposition layers applied onto the coating surface in order to thermally activate local atomic relaxation in the crystal structure of the coating layers. Without being bound by a particular theory, Applicants believe that the thermal energy resulting from laser radiation directed onto the deposition layers heats the deposition layers to high enough temperature to allow atoms of the deposition material to rearrange into more suitable crystal lattice structure substantially matching the crystal lattice structure normally achieved by high temperature heteroepitaxial growth such as may result when heteroepitaxial coating layers are applied by conventional MOCVD processes at temperatures above 900° C.

Figure 6A:
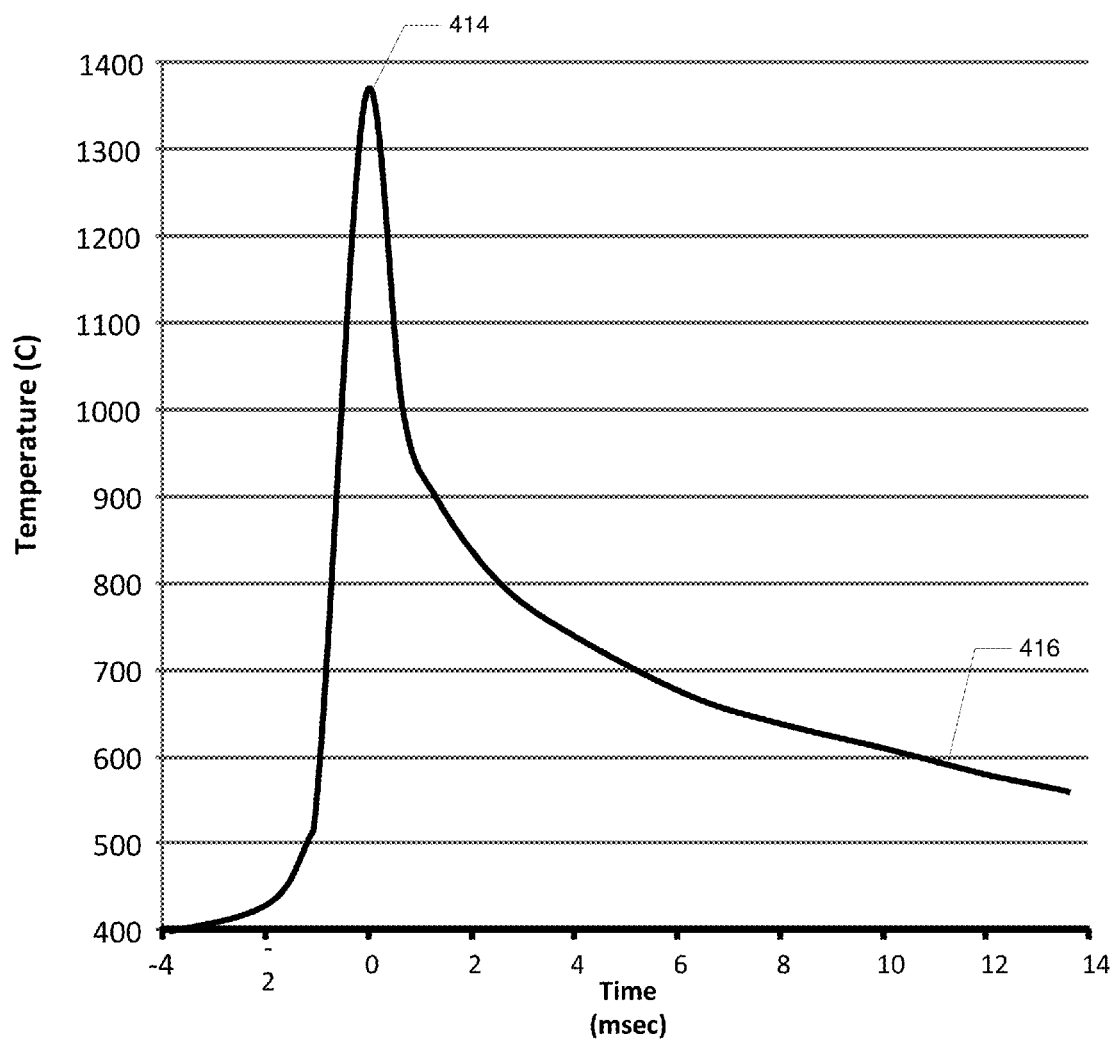
FIG. 6a illustrates an exemplary plot of process material temperature in ° C. vs time in msec for a laser annealing beam system according to the present invention.

Referring to FIG. 6a the temperature in ° C. of a coating surface illuminated by a laser annealing beam described above is plotted vs time in msec as determined by optical temperature sensing devices. In the plotted example dwell time of the laser beam radiation contact with the coating surface is 800 μsec, the beam width is 140 μm and the initial wafer or substrate temperature is approximately equal to the reaction temperature which in the present example is 400° C. The plot reveals that the temperature of the laser illuminated region spikes to about 1350° C. (414) and then cools back down to below 600'C (416) within ten milliseconds when the dwell time is approximately 0.8 ms and the beam width is approximately 140 μm wide line focus.

As discussed above, the laser annealing step can be integrated anywhere in the growth process; e.g. during or after the formation of the nucleation layer, during or after the growth of the GaN layer, or as a single post anneal of the entire film structure. Additionally, the laser anneal steps may be performed in-situ as depicted in FIG. 5 or the laser annealing steps may be performed ex-situ in a speared laser annealing system or a combination of in-situ and ex-situ laser annealing steps.

gain referring to FIG. 5 the in-situ laser annealing system (300) further includes an optical detector (352) and associated imaging optics (350) optionally disposed to monitor thermal emissions from the coating surface and process the spectral emission pattern to determine the temperature at the coating surface as it is laser annealed. Alternately the optical detector (352) may be used to calibrate the laser annealing system and then removed. A camera system (340) in electrical communication with the electronic controller (302) is optionally disposed to monitor substrate annealing and the camera system (340) may be usable to determine peak surface temperature during annealing steps. Additionally, electronic controller (302) may be programmed with different annealing recipes which may vary the dwell time according to the initial substrate temperature and the coating materials in order to raise or lower the peak annealing temperature (414) and or to otherwise vary the shape of the temperature profile.

Figure 6B:
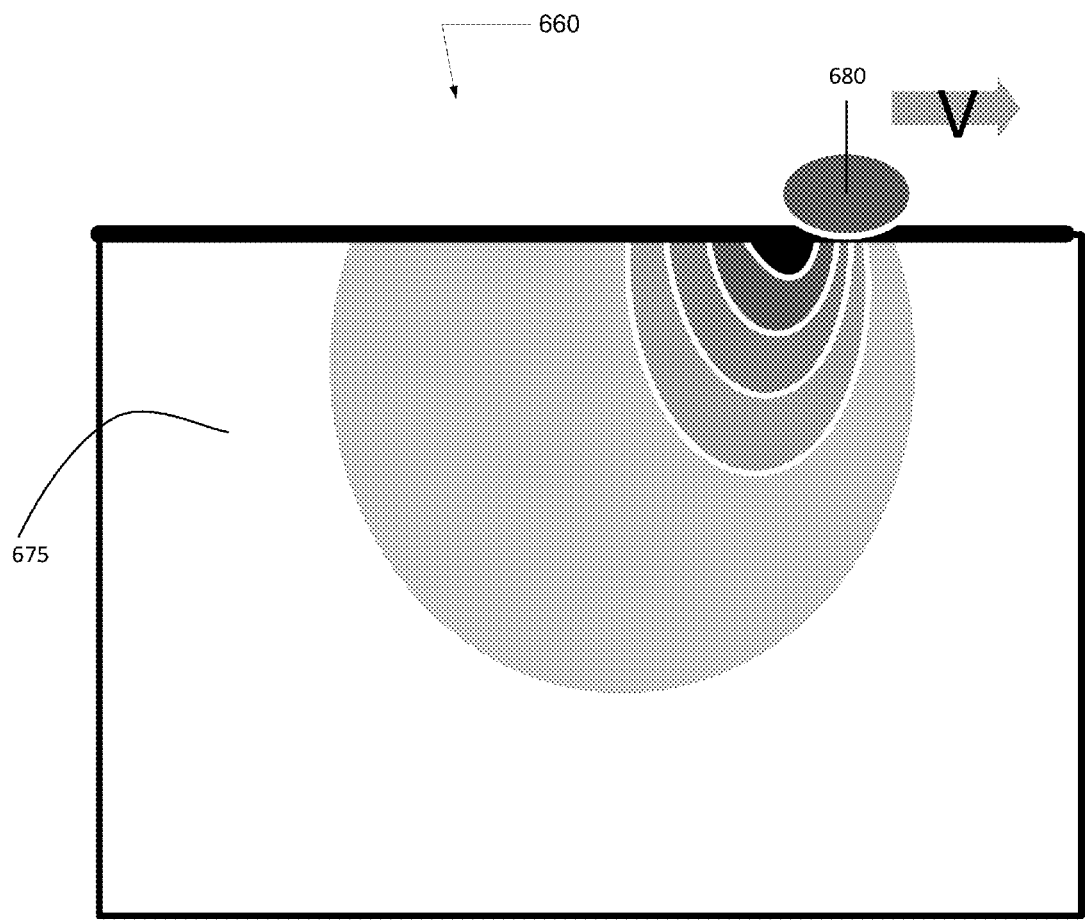
FIG. 6b illustrates an exemplary thermogram depicting temperature of a silicon substrate in response to illumination by the laser annealing beam profiled in FIG. 6a according to the present invention.

Referring now to FIG. 6b a thermograph (660) displays the temperature of a substrate (675) illuminated by a laser beam (680) with a relative velocity vs between the substrate and the laser beam. With brighter colors being associated with higher temperatures, the thermograph demonstrates the thermal energy is quickly dissipated from the beam impingement point into the substrate layer without significantly heating the entire substrate thickness. The plot (660) clearly demonstrates that the only the surface reaches the annealing temperature while the temperature of the majority of the substrate thickness is substantially unaffected by the laser annealing beam.

5.5 Thermal Stress Analysis

One of the key advantages of the present invention is its unique capability to control the energetics at the growth surface without heating the entire substrate. The laser spike annealing process can elevate the surface temperature to very high values locally to activate epitaxial growth modes. However, since the surrounding film and substrate remains at low temperature there is less residual thermal stress because thermal energy is rapidly dissipated to cooler regions of the substrate and coating layer.

In particular, the relative stress of films grown by the above described laser annealing and the prior art MOCVD are compared in view of Equations 1-3. As shown by the below listed results the present invention allows GaN device layer can be grown on silicon substrates with lower residual stress, and concomitantly thicker GaN films than are known in the prior art.

Equation 1 estimates the residual thermal stress a of a GaN film grown on a Si substrate. Ignoring the nucleation layer, we write, $$\sigma = \Delta a (T_{DEP} - T_{RT}) \frac{E_{GaN}}{1 - v_{GaN}} \quad (1)$$

Here, $\Delta\alpha = 2.22 \times 10^{-6} K^{-1}$ is the difference in the coefficient of thermal expansion between the GaN and Si, $T_{DEP}$ is the deposition temperature, $T_{RT} = 25°$ C. is the room temperature, $E_{GaN} = 200$ GPa is Young's modulus and $V_{GaN} = 0.24$ is Poisson's ratio.

Using equation 1 values for the thermal stress of σ=130 MPa for an ALD reaction temperature of 250° C. vs a=600 MPa for a MOCVD reaction temperature of 1050° C., are predicted which approximately scale with the reaction temperature providing about 4.5× less residual stress using a reaction temperature of 250° C.

This stress causes the Si wafer to bow with a radius of curvature given by equation 2, $$R = \frac{M_{Si} h_{Si}^2}{6 \sigma h_{GaN}} \quad (2)$$

In this formula $M_{Si} = 229$ is the biaxial modulus of the Si wafer, $h_{Si} = 725$ um is the thickness of a standard 200-mm-diameter wafer, and $h_{GaN}$ is the thickness of the GaN film. For large radii of curvature the bow B of a wafer of diameter D is given by equation 3, $$B = \frac{D^2}{8B} \quad (3)$$

Figure 7:
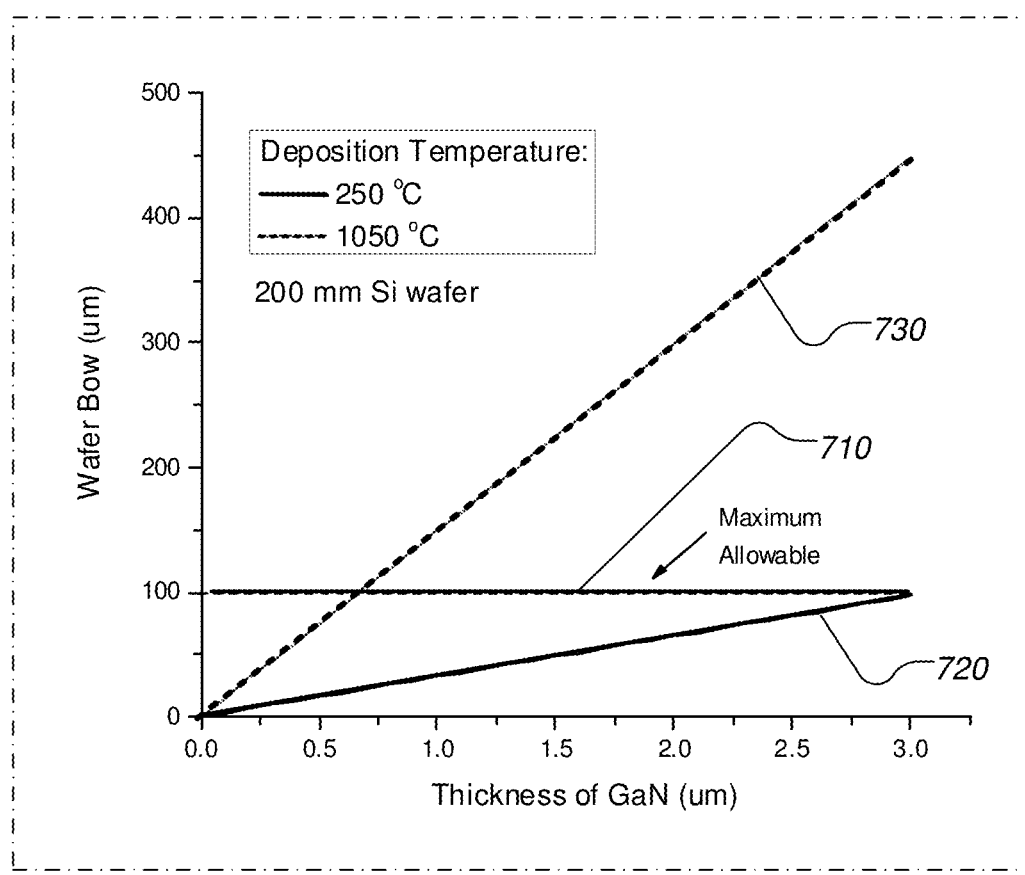
FIG. 7 is an exemplary plot of wafer bow as a function of GaN film thickness at two different deposition temperatures as predicted by equation 3.

In FIG. 7 we plot the bow of the 200 mm wafer as a function of the GaN thickness for the two deposition temperatures. The wafer deformation arises due to thermal stress in the GaN. The industry specification for the maximum allowable bow (710) of a 200 mm Si wafer is 100 μm. This specification is required for using the wafers in the automated wafer handling systems that are integrated into high volume production. Referring to FIG. 7 we find that the GaN film thickness that produces this amount of wafer bow is 3.0 um for the 250° C. deposition (720) and 0.6 um for the 1050° C. deposition (730). Another way to present this information is the following: a 3 μm film deposited by the above described ALD deposition process at 250° C. on a Si wafer will bow 100 μm, whereas the same film deposited onto a Si wafer using MOCVD will bow 500 μm. As expected, the lower temperature deposition process is preferred for growing thicker GaN substrates.

This does not include the impact of stress compensation layers are routinely deposited into the films for MOCVD depositions. Thus, according to one advantage of the present invention, stress compensation layers are not required.

5.6 Release of GaN from the Si Substrate for Vertical Devices

Figure 8:
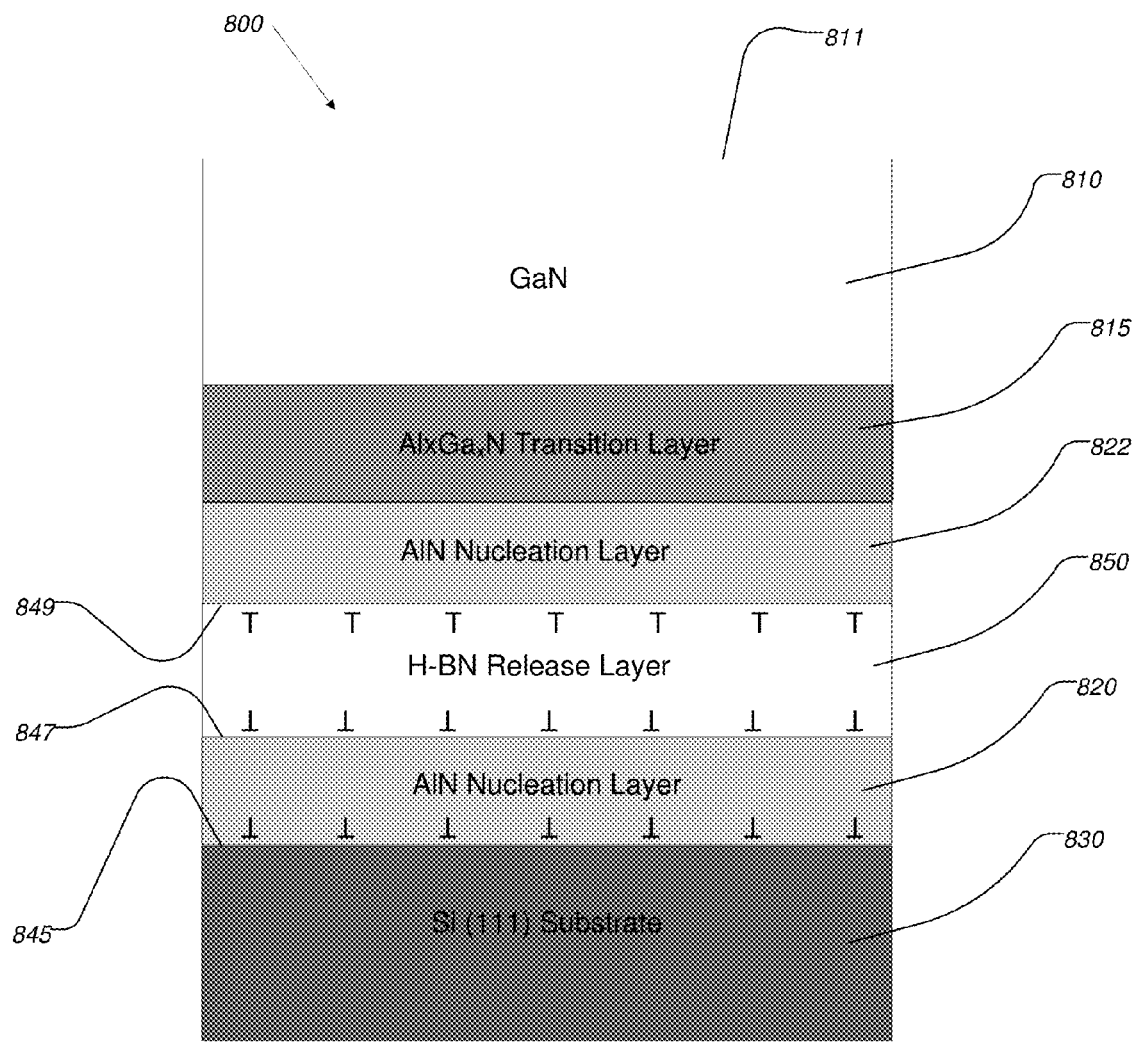
FIG. 8 is an exemplary schematic diagram depicting a material layer structure for providing a gallium nitride device layer on a silicon substrate with a release layer provided between the silicon substrate and the gallium nitride device layer according to the present invention.
Figure 10:
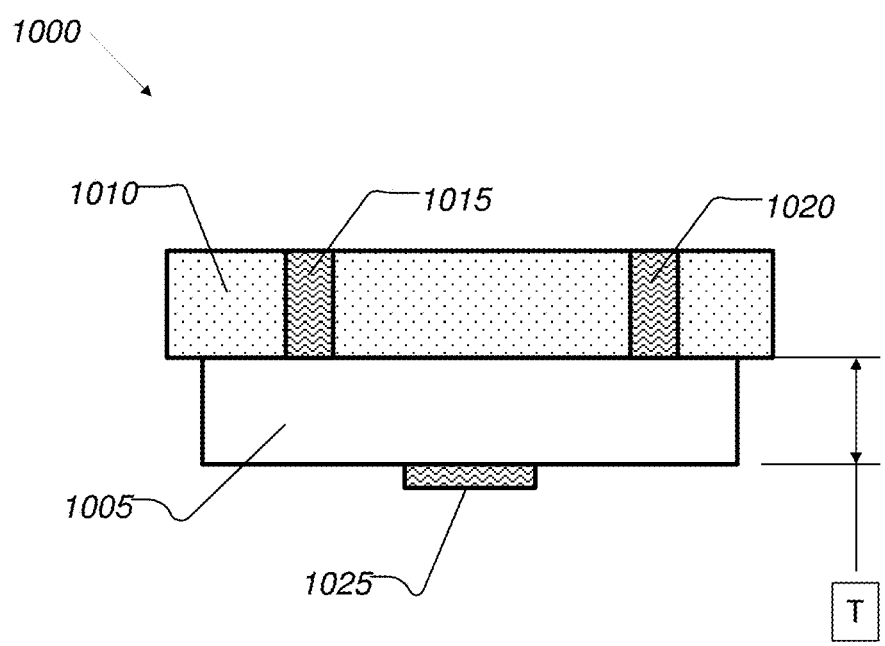
FIG. 10 is an exemplary GaN device having a vertical architecture according to the present invention.

Turning now to FIGS. 8 and 10, a schematic representation of a further embodiment of the present invention includes a release layer assembly (800) comprising a GaN device layer (810) and a boron nitride (BN) release layer (850) disposed between opposing AlN nucleation layers (820) and (822). In particular, the release layer (850) is provided to release the upper layers (822), (815) and (810) from the Si (111) substrate so that the GaN device layer can be fabricated for use in high voltage device with a vertical architecture. In one non-limiting exemplary embodiment, a vertical device architecture (1000) according to the present invention comprises a GaN device layer (1005) having a layer thickness T in excess of about 3 μm in order to provide a breakdown voltage in excess of about 1000 volts. The device is attached to a glass substrate (1010) or the like at atop surface of the device layer. The substrate (1010) is not the substrate that the GaN device layer was grown on. A source (1015) and a gate (1020) electrically interface with an active layer, (not shown) e.g. by a laser via passing through the glass substrate (1010). A drain (1025) is disposed on the bottom surface of the GaN substrate for electrical interface with an active device, not shown.

To fabricate the thicker GaN device layer (1005) for the high voltage vertical device (1000), it is desirable to release GaN films from the Si substrate is was grown on. Conventional techniques include attaching the GaN device layer (810) to a carrier layer and etching the back Si wafer away either chemically or mechanically.

According to the present invention a boron nitride (BN) release layer (850) is deposited onto the lower nucleation layer (820) which comprises AlN deposited as described above. In particular, the BN release layer (850) has a hexagonal phase crystal lattice structure where the bonding along the c-axis is of the weak van der Waals type (similar to graphite). This makes it easy to cleave h-BN release layer (850) mechanically. The release layer (850) is integrated into the structure (800) without compromising the quality of the GaN epitaxial growth. In particular, DME makes the h-BN release layer compatible with the AlN nucleation layer at the BN/AlN interfaces (847) to accommodate the lattice mismatch between AlN nucleation layers (820) and (822). AlN and BN are virtually immiscible so they form an atomically sharp interface. The lattice spacing of h-BN is a=2.5 A. Hence there are three interfaces with large lattice mismatch: the Si—AlN interface (845), the AlN—BN interface (847), and the BN—AlN interface (849). However, the BN-to-AlN mismatch is a nearly perfect integral ratio of 4-to-5, just as in the case of AlN-to-Si and the DEM match at each of the interfaces (847) and (849) supports single crystal growth initiation at each interface.

The method of deposition of the present invention comprises using ALD deposition technique combined with DEM matched material layers and one or more laser annealing cycles to grow a thin crystalline AlN nucleation layer (820) on the Si (111) substrate (830), then to grow a thin crystalline h-BN release layer (850) onto the AlN nucleation layer (820). A second thin crystalline AlN nucleation layer (822) is then grown onto the release layer (850) followed by growing the $Al_x Ga_{1-x}N$ transition layer on the AlN nucleation layer (822) and then growing the GaN device layer (810) onto the transition layer (815). In particular, the top GaN layer is grown to a thickness suitable for a vertical architecture application such thicknesses ranging from about 2-10 μm.

Once appropriately patterned, the top GaN device layer (811) is bonded to a carrier, (e.g. (1010) shown in FIG. 10) and the Si substrate (830) is released by cleaving the BN release layer (850). Thereafter the residual AlN layer (822) is etched away and electrical contacts (e.g. (1025) shown in FIG. 10) are formed on the transition layer (815) to make a vertical device.

It will also be recognized by those skilled in the art that, while the invention has been described above in terms of preferred embodiments, it is not limited thereto. Various features and aspects of the above described invention may be used individually or jointly. Further, although the invention has been described in the context of its implementation in a particular environment, and for particular applications (e.g. for heteroepitaxial grown of GaN device layers on silicon substrates), those skilled in the art will recognize that its usefulness is not limited thereto and that the present invention can be beneficially utilized in any number of environments and implementations where it is desirable to grow low temperature film layers with heteroepitaxial or homoepitaxial growth to form various device layers on silicon substrates using low temperature ALD deposition processes to avoid the detrimental effects of high reaction temperatures. Accordingly, the claims set forth below should be construed in view of the full breadth and spirit of the invention as disclosed herein.

What is claimed:
1. A method comprising:
supporting a silicon substrate inside a deposition chamber, the silicon substrate including a silicon substrate coating surface;
applying an aluminum nitride nucleation layer onto the silicon substrate coating surface using a first atomic layer deposition method;
applying a transition layer over the aluminum nitride nucleation layer using a second atomic layer deposition method; and
applying a gallium nitride device layer over the transition layer using a third atomic layer deposition method, wherein an atomic layer deposition reaction temperature for each of the first, second, and third atomic layer deposition methods is a same temperature.

2. The method of claim 1 wherein an atomic layer deposition reaction temperature for each of the first, second, and third atomic layer deposition methods is between 80° C. and 800° C.

3. The method of claim 1 wherein an atomic layer deposition reaction temperature for each of the first, second, and third atomic layer deposition methods is between 80° C. and 400° C.

4. The method of claim 1 wherein the step of applying the transition layer comprises applying a plurality of different material layers wherein each of the plurality of different material layers comprises an $Al_x Ga_{1-x}N$ compound and wherein each of the plurality of different $Al_x Ga_{1-x}N$ compounds is applied by a different atomic layer deposition method.

5. The method of claim 4 wherein each of the first, the second and the third atomic layer deposition methods and each of the different atomic layer deposition methods used is performed at the same atomic layer deposition reaction temperature.

6. The method of claim 1 wherein the silicon substrate comprises a single crystal, wherein the silicon substrate coating surface comprises a crystallographic plane, and wherein the step of applying the gallium nitride device layer over the transition layer creates a material interface characterized by both a coefficient of thermal expansion mismatch and a crystal lattice spacing mismatch, wherein one of the coefficient of thermal expansion mismatch or the crystal lattice spacing mismatch is smaller at the material interface than a coefficient of thermal expansion mismatch or a crystal lattice spacing mismatch at a material interface between gallium nitride deposited on the crystallographic plane of silicon.

7. The method of claim 1 further comprising heating one of the aluminum nitride nucleation layer, the transition layer, or the gallium nitride device layer to an annealing temperature above 900° C. for less than 20 msec.

8. The method of claim 7 wherein after heating one of the aluminum nitride nucleation layer, the transition layer, or the gallium nitride device layer to the annealing temperature, cooling said heated layer to a temperature below 900° C., wherein the duration of the combined heating and cooling cycle is between 300 and 2000 μs.

9. The method of claim 7 wherein the step of applying the transition layer comprises applying a plurality of different material layers wherein each of the plurality of different material layers comprises an $Al_x Ga_{1-x}N$ compound and wherein each of the plurality of different $Al_x Ga_{1-x}N$ compounds is applied by a different atomic layer deposition method, and wherein the heating step includes
performing a single first heating step to thermally anneal an entire thickness of the aluminum nitride nucleation layer,
performing a plurality of second heating steps, one to thermally anneal an entire thickness of each one of the plurality of different material layers of the transition layer, and
performing a third heating step to thermally anneal an entire thickness of the gallium nitride device layer.

10. The method of claim 7 wherein the step of applying the transition layer comprises applying a plurality of different material layers wherein each of the plurality of different material layers comprises an $Al_xGa_{1-x}N$ compound and wherein each of the plurality of different $Al_xGa_{1-x}N$ compounds is applied by a different atomic layer deposition method;

wherein each of said different atomic layer deposition methods comprises performing a plurality of sequential self-limiting atomic layer deposition cycles with each self-limiting atomic layer deposition cycle depositing a single monolayer of material onto the coating surface; and wherein a heating step is performed after the completion of each self-limiting atomic layer deposition cycle.

11. The method of claim 7 wherein the step of applying the transition layer comprises applying a plurality of different material layers wherein each of the plurality of different material layers comprises an $Al_xGa_{1-x}N$ compound and wherein each of the plurality of different $Al_xGa_{1-x}N$ compounds is applied by a different atomic layer deposition method;

wherein each of said different atomic layer deposition methods comprises performing a plurality of sequential self-limiting atomic layer deposition cycles with each self-limiting atomic layer deposition cycle depositing a single monolayer of material onto the coating surface; and wherein the heating step is performed after each completion of a selected integer number of the sequential self-limiting atomic layer deposition cycles.

12. The method of claim 7 wherein heating one of the aluminum nitride nucleation layer, the transition layer, or the gallium nitride device layer comprises scanning a focused laser beam over the entire coating surface.

13. The method of claim 12 further comprising generating the focused laser beam with a spectral output that includes one or more wavelength that are readily absorbed by the silicon substrate.

14. The method of claim 12 further comprising generating the focused laser beam with a narrow spectral output having a center wavelength between about 515 and 580 nm.

15. The method of claim 7 wherein heating one of the aluminum nitride nucleation layer, the transition layer, or the gallium nitride device layer is performed while the silicon substrate is supported inside the atomic layer deposition chamber and while the atomic layer deposition chamber is maintained at an internal pressure in the range of 1-500 mTorr.

16. The method of claim 7 wherein heating one of the aluminum nitride nucleation layer, the transition layer, or the gallium nitride device layer is performed outside the atomic layer deposition chamber.

* * * * *